US008882561B2

(12) United States Patent
Dyer et al.

(10) Patent No.: US 8,882,561 B2
(45) Date of Patent: Nov. 11, 2014

(54) MULTIFUNCTION REMOVABLE MEMORY DEVICE WITH ORNAMENTAL HOUSING

(75) Inventors: Ian Dyer, Los Angeles, CA (US); Paul King, Newbury Park, CA (US); Joy Burns, Redondo Beach, CA (US); Kislap Ongchangco, Torrance, CA (US); Emily Kelly, Torrance, CA (US); Carrie Buse, Santa Monica, CA (US); Kenneth Heimann, Lake Elsinore, CA (US); Christopher Goff, Redondo Beach, CA (US)

(73) Assignee: Mattel, Inc., El Segundo, CA (US)

( * ) Notice: Subject to any disclaimer, the term of this patent is extended or adjusted under 35 U.S.C. 154(b) by 2179 days.

(21) Appl. No.: 11/697,356

(22) Filed: Apr. 6, 2007

(65) Prior Publication Data

US 2008/0014829 A1    Jan. 17, 2008

Related U.S. Application Data

(60) Provisional application No. 60/790,256, filed on Apr. 7, 2006, provisional application No. 60/810,615, filed on Jun. 2, 2006, provisional application No. 60/848,292, filed on Sep. 29, 2006, provisional application No. 60/849,272, filed on Oct. 2, 2006, provisional application No. 60/849,247, filed on Oct. 3, 2006, provisional application No. 60/849,589, filed on Oct. 4, 2006.

(51) Int. Cl.
*A63H 17/26* (2006.01)
*H05K 5/02* (2006.01)

(52) U.S. Cl.
CPC ............ *H05K 5/0243* (2013.01); *H05K 5/0278* (2013.01)
USPC ........................... 446/484; 446/471; 446/491

(58) Field of Classification Search
USPC ......................................................... 446/297
See application file for complete search history.

(56) References Cited

U.S. PATENT DOCUMENTS

| 5,624,265 A | 4/1997 | Redford et al. |
| 5,746,602 A | 5/1998 | Kikinis |

(Continued)

FOREIGN PATENT DOCUMENTS

| CN | 2554728 | 6/2003 |
| CN | 1438260 | 8/2003 |

(Continued)

OTHER PUBLICATIONS

PCT International Search Report and Written Opinion for PCT/US07/08940 Issued Sep. 15, 2008.

(Continued)

*Primary Examiner* — Tramar Harper
(74) *Attorney, Agent, or Firm* — Kolisch Hartwell, PC

(57) ABSTRACT

An electronic toy memory device is disclosed which may include memory, a processor and may depict a character on the housing. The memory device may store audio files and network addresses. Connecting the memory device to a computer may launch a software application with content associated with the character depicted on the memory device housing. Connecting to a server over the internet may launch additional software applications stored on the server with additional content associated with the character depicted on the housing. The character may be depicted on a shell which is frictionally attached to the housing and further includes accessories such as clothes which may be frictionally attached to the shell.

20 Claims, 10 Drawing Sheets

(56) References Cited

U.S. PATENT DOCUMENTS

| | | | |
|---|---|---|---|
| 5,986,651 A | 11/1999 | Reber et al. | |
| 5,987,612 A | 11/1999 | Takagawa et al. | |
| 6,243,261 B1 | 6/2001 | Janik et al. | |
| 6,248,946 B1 | 6/2001 | Dwek | |
| 6,292,272 B1 | 9/2001 | Okauchi et al. | |
| 6,314,574 B1 | 11/2001 | Chan | |
| 6,319,010 B1 | 11/2001 | Kikinis | |
| 6,370,603 B1 | 4/2002 | Silverman et al. | |
| 6,372,947 B1 | 4/2002 | Ely et al. | |
| 6,372,974 B1 | 4/2002 | Gross et al. | |
| 6,393,462 B1 | 5/2002 | Mullen | |
| 6,423,892 B1 | 7/2002 | Ramaswamy | |
| 6,494,762 B1* | 12/2002 | Bushmitch et al. | 446/268 |
| 6,525,767 B2 | 2/2003 | Saito et al. | |
| 6,567,273 B1* | 5/2003 | Liu et al. | 361/737 |
| 6,571,211 B1 | 5/2003 | Dwyer et al. | |
| 6,581,122 B1 | 6/2003 | Sarat | |
| 6,612,501 B1 | 9/2003 | Woll et al. | |
| 6,631,098 B2 | 10/2003 | Chang et al. | |
| 6,675,233 B1 | 1/2004 | Du et al. | |
| 6,692,330 B1* | 2/2004 | Kulick | 446/297 |
| 6,697,944 B1 | 2/2004 | Jones et al. | |
| 6,719,604 B2* | 4/2004 | Chan | 446/297 |
| 6,732,218 B2 | 5/2004 | Overtoom et al. | |
| 6,738,901 B1 | 5/2004 | Boyles et al. | |
| 6,763,226 B1 | 7/2004 | McZeal | |
| 6,773,325 B1 | 8/2004 | Mawle et al. | |
| 6,792,487 B2 | 9/2004 | Kao | |
| 6,801,815 B1 | 10/2004 | Filo et al. | |
| 6,808,400 B2 | 10/2004 | Tu | |
| 6,845,408 B1 | 1/2005 | Lemke et al. | |
| 6,850,909 B1 | 2/2005 | Aiello et al. | |
| 6,915,176 B2 | 7/2005 | Novelli et al. | |
| 6,934,841 B2 | 8/2005 | Boyles et al. | |
| 6,957,292 B2 | 10/2005 | Croyle | |
| 6,979,210 B2 | 12/2005 | Regen et al. | |
| 6,986,030 B2 | 1/2006 | Shmueli et al. | |
| 6,996,636 B2 | 2/2006 | Hung et al. | |
| 7,004,780 B1 | 2/2006 | Wang | |
| 7,009,847 B1* | 3/2006 | Wu et al. | 361/737 |
| 7,037,166 B2 | 5/2006 | Shrock et al. | |
| 7,039,759 B2 | 5/2006 | Cheng et al. | |
| 7,046,297 B2 | 5/2006 | Chou | |
| 7,065,417 B2 | 6/2006 | Moon et al. | |
| 7,070,425 B2 | 7/2006 | Regen et al. | |
| 7,081,033 B1* | 7/2006 | Mawle et al. | 446/175 |
| 7,083,095 B2 | 8/2006 | Hendrick | |
| 7,090,515 B2 | 8/2006 | Regen et al. | |
| 7,092,256 B1 | 8/2006 | Salazar et al. | |
| 7,111,051 B2 | 9/2006 | Nobakht et al. | |
| 7,113,220 B1 | 9/2006 | Misawa et al. | |
| 7,151,664 B2 | 12/2006 | Hosey | |
| 7,170,828 B2 | 1/2007 | Estevez | |
| 7,288,028 B2 | 10/2007 | Rodriquez et al. | |
| 2001/0003941 A1 | 6/2001 | Sawada et al. | |
| 2002/0087225 A1 | 7/2002 | Howard | |
| 2002/0116277 A1 | 8/2002 | Kraft | |
| 2002/0159601 A1 | 10/2002 | Bushmitch | |
| 2002/0166060 A1 | 11/2002 | Hsieh | |
| 2003/0090588 A1 | 5/2003 | Wu | |
| 2003/0099919 A1* | 5/2003 | Love | 434/157 |
| 2003/0115247 A1 | 6/2003 | Simpson | |
| 2004/0003150 A1 | 1/2004 | Deguchi | |
| 2004/0039851 A1 | 2/2004 | Tang | |
| 2004/0043806 A1 | 3/2004 | Kirby | |
| 2004/0054754 A1 | 3/2004 | Hwang | |
| 2004/0059927 A1 | 3/2004 | Chen | |
| 2004/0072498 A1 | 4/2004 | Yeon | |
| 2004/0073727 A1 | 4/2004 | Moran | |
| 2004/0074264 A1 | 4/2004 | Kung | |
| 2004/0103317 A1 | 5/2004 | Burns | |
| 2004/0130657 A1 | 7/2004 | Hsu | |
| 2004/0174452 A1 | 9/2004 | Kinemura | |
| 2004/0210758 A1 | 10/2004 | Jang | |
| 2004/0212966 A1 | 10/2004 | Fisher | |
| 2004/0218051 A1 | 11/2004 | Hsu | |
| 2004/0267978 A1 | 12/2004 | Wu | |
| 2005/0012850 A1 | 1/2005 | Wang | |
| 2005/0012853 A1 | 1/2005 | Wang | |
| 2005/0015530 A1 | 1/2005 | Hsieh | |
| 2005/0024526 A1 | 2/2005 | Wang | |
| 2005/0057538 A1 | 3/2005 | Morse | |
| 2005/0060266 A1 | 3/2005 | DeMello | |
| 2005/0076388 A1 | 4/2005 | Morse | |
| 2005/0086389 A1 | 4/2005 | Chang | |
| 2005/0086602 A1 | 4/2005 | Philyaw | |
| 2005/0138218 A1 | 6/2005 | Chen | |
| 2005/0154815 A1 | 7/2005 | Molander | |
| 2005/0162545 A1 | 7/2005 | Jeon | |
| 2005/0182858 A1 | 8/2005 | Lo | |
| 2005/0210168 A1 | 9/2005 | Chen | |
| 2005/0228782 A1 | 10/2005 | Bronstein | |
| 2005/0245317 A1 | 11/2005 | Arthur | |
| 2005/0246455 A1 | 11/2005 | Bhesania | |
| 2005/0251593 A1 | 11/2005 | Lin | |
| 2005/0289646 A1 | 12/2005 | Zimmer | |
| 2006/0015826 A1* | 1/2006 | Shiozawa et al. | 715/864 |
| 2006/0026304 A1 | 2/2006 | Price | |
| 2006/0026332 A1 | 2/2006 | Yen | |
| 2006/0036785 A1 | 2/2006 | Tseng | |
| 2006/0041934 A1 | 2/2006 | Hetzler | |
| 2006/0053238 A1 | 3/2006 | Hung | |
| 2006/0053239 A1 | 3/2006 | Zheng | |
| 2006/0064761 A1 | 3/2006 | Multerer | |
| 2006/0069841 A1 | 3/2006 | Qin | |
| 2006/0075151 A1 | 4/2006 | Lin | |
| 2006/0080491 A1 | 4/2006 | Uchizono | |
| 2006/0095642 A1 | 5/2006 | Hesse | |
| 2006/0095647 A1 | 5/2006 | Battaglia | |
| 2006/0112203 A1 | 5/2006 | Lee | |
| 2006/0123180 A1 | 6/2006 | Derr | |
| 2006/0130129 A1 | 6/2006 | Dai | |
| 2006/0136996 A1 | 6/2006 | Wang | |
| 2006/0143716 A1 | 6/2006 | Ikemoto | |
| 2006/0150257 A1 | 7/2006 | Leung | |
| 2006/0168653 A1 | 7/2006 | Contrera | |
| 2006/0197753 A1 | 9/2006 | Hotelling | |
| 2006/0252548 A1 | 11/2006 | Sasaki | |
| 2006/0287110 A1 | 12/2006 | Klitsner | |
| 2007/0006290 A1 | 1/2007 | Li | |
| 2007/0042672 A1* | 2/2007 | Tawil | 446/369 |
| 2007/0060020 A1* | 3/2007 | Civettini et al. | 446/484 |
| 2007/0067309 A1 | 3/2007 | Klein | |
| 2007/0067835 A1 | 3/2007 | Koistinen | |
| 2007/0087652 A1* | 4/2007 | Hsu | 446/175 |
| 2007/0093170 A1 | 4/2007 | Zheng | |
| 2007/0128978 A1* | 6/2007 | Nishino et al. | 446/484 |
| 2007/0164100 A1 | 7/2007 | Bortnik | |
| 2007/0218997 A1 | 9/2007 | Cho | |

FOREIGN PATENT DOCUMENTS

| | | |
|---|---|---|
| CN | 2669505 | 1/2005 |
| CN | 2766320 | 3/2006 |
| EP | 991033 | 4/2000 |
| EP | 1720316 | 8/2006 |
| EP | 1701354 | 9/2006 |
| GB | 2409783 | 6/2005 |
| JP | 01033656 | 2/1989 |
| JP | 01042759 | 2/1989 |
| JP | 02010457 | 1/1990 |
| JP | 20001155075 | 6/2001 |
| JP | 2002007005 | 1/2002 |
| JP | 2003216586 | 7/2003 |
| JP | 2003228451 | 8/2003 |
| JP | 2003263253 | 9/2003 |
| WO | 0112285 | 2/2001 |
| WO | 0157697 | 8/2001 |

OTHER PUBLICATIONS

"IBM Portable Internet Settings." from the IBM Technical Disclosure Bulletin in Dec. 1997.

(56) References Cited

OTHER PUBLICATIONS

State Intellectual Property Office of P.R.C., Office Action, May 6, 2010, 5 pages.
European Patent Office, Supplementary European Search Report, Feb. 25, 2011, 5 pages.
Instituto Mexicano de la Propiedad Industrial, Office Action for Mexican application MX/a/2008/012620, Nov. 6, 2012, 10 pages.
The Patent Office of the People's Republic China, Office Action, Sep. 26, 2011, 10 pages.
Instituto Mexicano De La Propiedad Industrial, Office Action, Oct. 3, 2011, 10 pages.
European Patent Office; Communication Pursuant to Article 94(3) EPC for European application 07 755 270.1; 4 pages; mailing date Jul. 23, 2012.
Instituto Mexicano de la Propiedad Industrial; Office Action for Mexican application MX/a/2008/012620; 9 pages including English Translation; Apr. 4, 2012.
State Intellectual Property Office of the People's Republic of China, Office Action for Chinese Application No. 200780012621, Jan. 23, 2014, 19 pages.
The Patent Office of the People's Republic of China, Office Action, Mar. 8, 2012, 10 pages.

\* cited by examiner

US 8,882,561 B2

MULTIFUNCTION REMOVABLE MEMORY DEVICE WITH ORNAMENTAL HOUSING

RELATED APPLICATIONS

The present application claims the benefit of U.S. Provisional Patent Application Ser. Nos. 60/790,256 filed on Apr. 7, 2006; 60/810,615 filed on Jun. 2, 2006; 60/848,292 filed on Sep. 29, 2006; 60/849,272 filed on Oct. 2, 2006; 60/849,247 filed Oct. 3, 2006 and 60/849,589 filed on Oct. 4, 2006. The complete disclosures of all of the above applications are hereby incorporated by reference herein in their entirety and for all purposes.

FIELD OF THE DISCLOSURE

The present disclosure relates to removable memory devices for use in conjunction with computers and other electronic devices and, more specifically, to removable memory devices having an ornamental housing, capable of storing files, playing music, taking pictures, storing and launching software applications, and connecting to stored network addresses to play games with other users and share data and files.

Examples of on line games with tokens are disclosed in U.S. Pat. Nos. 6,372,974; 6,423,892; 6,612,501; 6,631,098; 6,763,226; 6,979,210; 6,996,636 and 7,151,664, and Publication Nos. 20040003150; 20040043806; 20060287110 and WO0112285. Examples of dolls associated with computer applications are disclosed in U.S. Pat. No. 5,746,602; U.S. Pat. No. 6,319,010 and U.S. Pat. No. 6,773,325. Examples of memory devices with retractable connectors are disclosed in U.S. Pat. Nos. 6,792,487; 6,808,400; 6,979,210; 7,004,780; 7,070,425; 7,090,515 and 7,092,256 and Publication Nos. 20040074264 and 20040212966. The disclosures of all the above-referenced patents and publications are incorporated herein by reference.

SUMMARY OF THE DISCLOSURE

The removable memory device may have an ornamental, doll-shaped housing and may be configured to operate in either a stand-alone mode or a connected mode. In the stand-alone mode, the removable memory device may function as a camera, a music player and/or a radio to play games, play music files, take pictures and store the pictures and/or store files and data. The removable memory device may plug into a communication port such as a USB or similarly configured port of a computer. In the connected mode, the removable memory device may initiate software applications on a computer such as interactive video games and provide links to Web sites. Additionally, the removable memory device may transfer data, photo files and music files between the computer and memory device.

The ornamental housing of the removable memory device may be configured with a depiction or the shape of a character, doll or figure. The ornamental housing may have removable portions that depict the character. The removable portions may have additional removable portions that depict clothes, hairstyles and/or character accessories such as a purse or jewelry. The information, music, network addresses, identification data and files saved on the removable memory device may pertain to the character, doll or figure depicted on the ornamental housing.

The advantages of the present technology will be understood more readily after consideration of the drawings and the Detailed Description of the Preferred Embodiments.

DETAILED DESCRIPTION OF THE PREFERRED EMBODIMENTS

Figure 1:
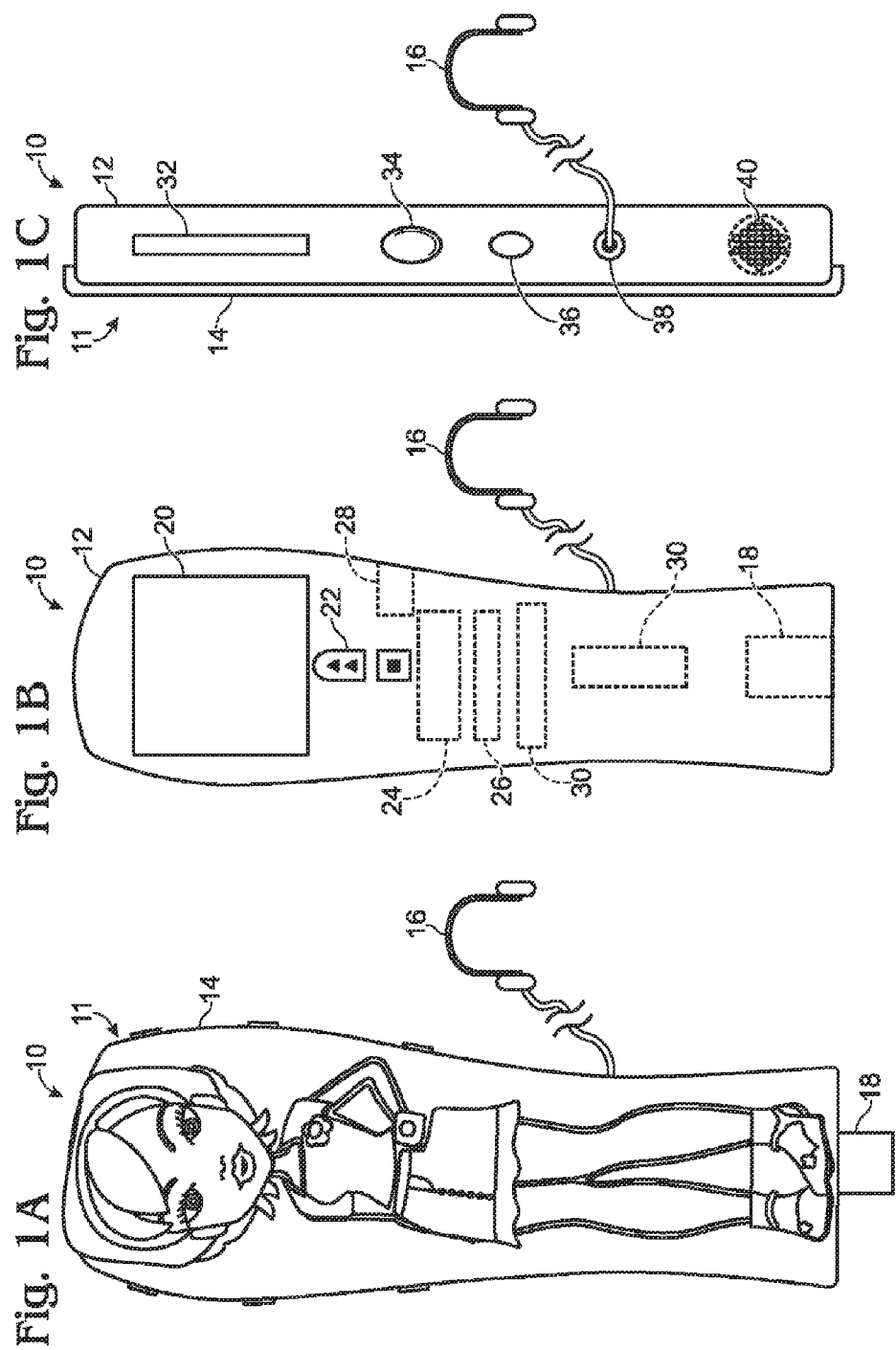
FIG. 1A is a front view of a removable memory device with an ornamental housing.
FIG. 1B is a back view of a removable memory device with an ornamental housing.
FIG. 1C is a side view of a removable memory device with an ornamental housing.

Referring to the attached drawings, wherein like numerals indicate like elements, there is shown in FIGS. 1A-C a removable memory device 10. Removable memory device 10 includes a housing 11 with a case 12 and a character shell 14, earphones 16 and data connector 18 shown in an extended position in FIG. 1A and in a retracted position in housing 11 in FIG. 1B, a screen 20 and user inputs such as one or more buttons 22. Memory device 10 may also include a processor 24, memory 26, a camera 28, a power supply or battery 30 all internal to case 12 and shown with dotted lines. Device 10 may include memory connector 32, a camera lens 34, a light or one or more LEDs 36, and audio output devices, such as an audio jack or earphone connector 38 for connecting to earphones 16 and a speaker 40.

Figure 2:
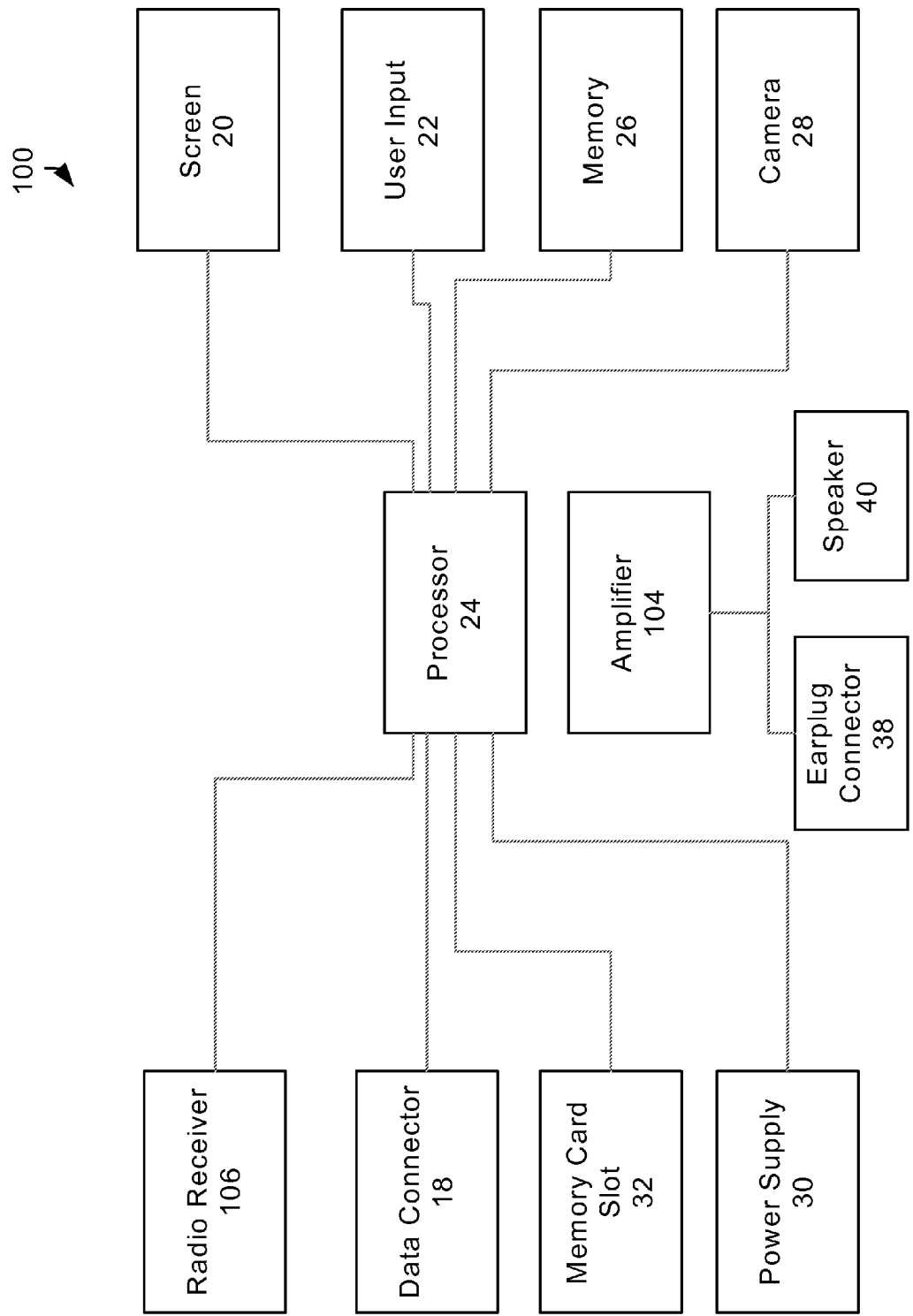
FIG. 2 is a block diagram of the functional components of an exemplary removable memory device.

FIG. 2 shows a functional block diagram 100 showing an example of functional components which may be included in memory device 10. Processor 24 is operably connected to data connector 18, screen 20, user input 22, memory 26, camera 28, power supply or battery 30, memory connector 32, earplug jack or connector 38 and speaker 40. Processor 24 may also be operably connected to an amplifier 104 and a radio receiver 106. Earplug connector 38 and speaker 40 may receive a signal generated by amplifier 104.

User inputs 22 may be activated to implement functions including play, stop, forward, backward, pause, volume, on/off, selecting music files and other common functions found in music listening devices. Device 10 may also turn off automatically upon realization of pre-set conditions.

User inputs 22 may control operations of camera 28. Screen 20 may display such information as the number or name of the song currently playing, what picture currently is shown, how many picture files are available, and other similar information.

A user may manage or configure removable memory device 10 at user inputs 22. A user may set parameters, preferences or display options. A user may be able to delete or otherwise remove information stored on removable memory device 10. Removing information from removable memory device 10 permits a user to free-up space on removable memory device 10 to add new or additional data.

Data connector 18 may retract and extend from case 12. Case 12 may include a slider (not shown) with detents which moves connector 18 in relation to case 12 and fixes connector 18 in place in extended or retracted positions. Removable memory device 10 may alternatively, or in addition, include a removable cover to slide over connector 18 to provide protection.

Music files used with memory device 10 may be in any suitable format including MP3, FP3, FPI or WAV. Picture files used with memory device 10 may be in any suitable format as well, including MPEG, JPEG, WMA or TIFF. DRM security protocols may be used.

LEDs 36 may function separately from character shell 14. The one or more LEDs 36 may function as indicator light(s) that indicate the operating mode of the removable memory device, and/or may function in conjunction with the ornamental cover as additional ornamental feature(s). The one or more LEDs may also function as an indicator light that emits light of one or more colors that each correspond to a different operational mode of the removable memory device.

Figure 3:
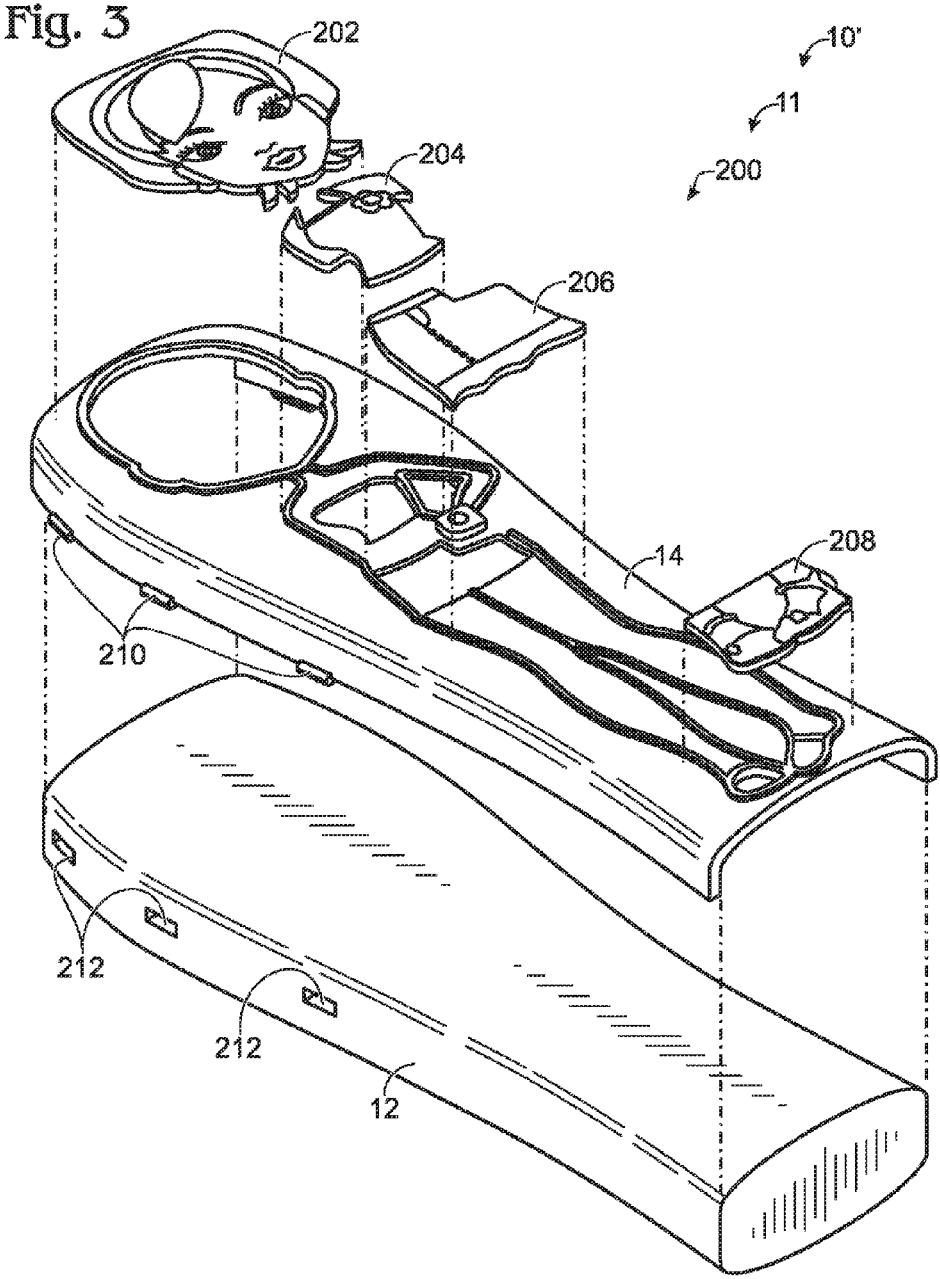
FIG. 3 is an exploded view of the housing of an exemplary removable memory device including a case, a character shell and accessories.

Housing 11 may comprise case 12 that defines an enclosure, and character shell 14. Character shell 14 may be a portion which separates from case 12 and is frictionally retained when assembled to case 12. FIG. 3 is an exploded perspective view of an exemplary memory device 10' including case 12 and character shell 14. Character shell 14 may include a depiction of a character and may further support accessory elements 200 that attach to character shell 14.

Character shell 14, in this example, includes a head and face 202, a blouse 204, a skirt 206 and shoes 208. These accessory elements 200 may enhance or embellish the character depicted on character shell 14. Accessory elements 200 may be frictionally attached to shell 14. A user may collect several accessory elements 200 and change the elements mounted to character shell 14 to display the character in different outfits.

Character shell 14 may have tabs 210 and case 12 may have detents 212 configured to accept tabs 210. Tabs 210 and detents 212 may frictionally retain character shell 14 to case 12.

Figure 4:
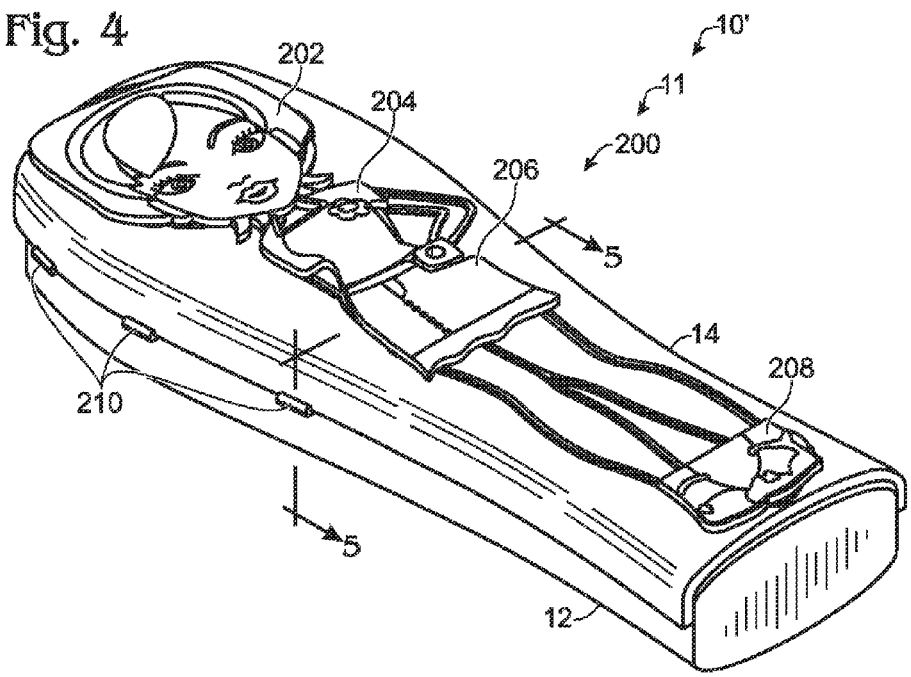
FIG. 4 is a diagram similar to FIG. 3 showing the exemplary memory device with a shell and accessories assembled to the case.

FIG. 4 shows exemplary memory device 10', similar to FIG. 3, with character shell 14 attached to case 12 and accessory elements 202, 204, 206 and 208 assembled and attached to character shell 14. The assembled character shell 14 and accessory elements 200 resemble a girl dressed in an outfit. Accessory elements 200 may further include manually removable accessories such as additional clothes, a hairdo, a purse or jewelry (not shown).

Alternatively, case 12 and shell 14 may be a single unit. Accessory elements 200 may be frictionally attached to case 12 and character shell 14 may be an integral part of case 12 and housing 11.

Figure 5:
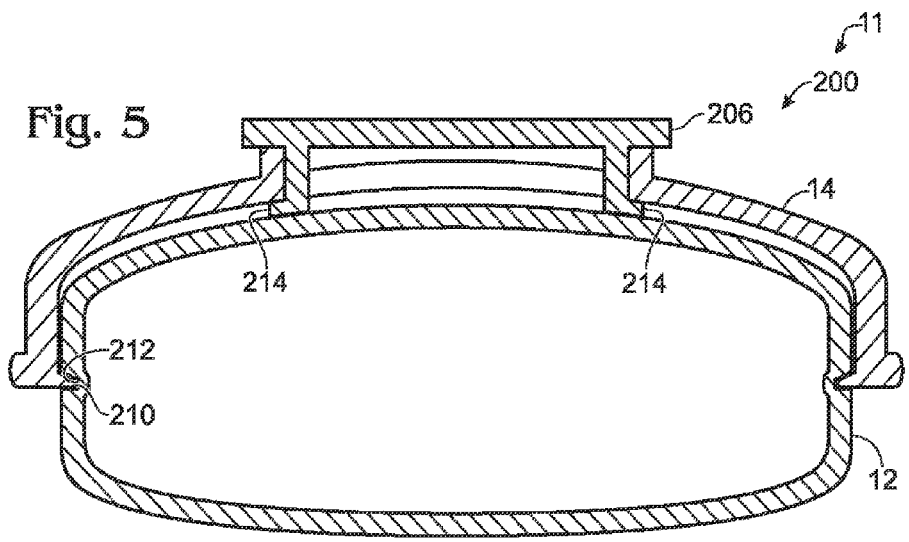
FIG. 5 is a cross sectional view of the memory device of FIG. 4 illustrating an example of a character shell and an accessory assembled to the case.

FIG. 5 is a cross section of the exemplary memory device 10' of FIG. 4 showing accessory element 206 frictionally attached to character shell 14 and character shell 14 frictionally attached to case 12 by tab 210 engaging detent 212. Element 206 may have additional tabs 214 that engage character shell 14 to retain element 206. Other accessory elements 200 may have additional tabs configured to retain the element to character shell 14.

Character shell 12 may depict a doll, action figure, or other similar character. Character shell 12 may also depict a person, such as the user, by integrating a photograph, sketch, or other depiction into the housing. Character shell 14 may depict a character in relief as a textured surface. The user may be able to customize their memory device 10 by combining different accessory elements 200 and/or character shells 14.

Character shell 14 may be transparent, translucent and/or opaque. For example, some regions of the first and/or second portions may be opaque so as to form a design that prevents light from passing through, and other regions of the first and/or second portions may be transparent and/or translucent so as to allow visible light to pass through. Character shell 14 may act as a light guide.

Character configurations and accessories shown in FIGS. 3, 4 and 5 are examples for the purpose of illustration. Other embodiments of the memory device may include more, fewer or different accessories. Face accessory 202 may be integrated into character shell 14 and may not be an accessory. The character depicted may portray a different character, an animal, an avatar or any other depiction. The tabs and detents may have a different form than that shown and/or more or fewer tabs and detents may be used. Other forms of attachment of the shell to the case may be used.

Figure 6:
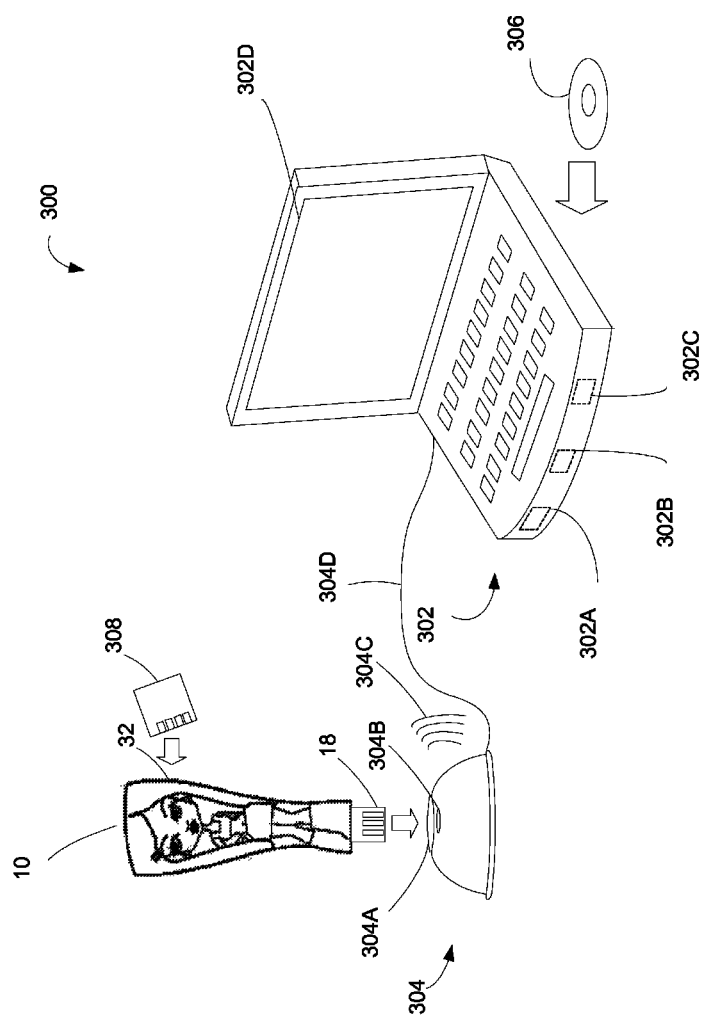
FIG. 6 is a perspective view of an exemplary electronic toy system with a removable memory device, a docking station, a computer, and a memory medium.

FIG. 6 is a perspective view of an exemplary toy electronic system 300 including memory device 10 with data connector 18, a computer 302 including a connector 302A, a computer processor 302B and memory 302C shown by dotted lines and a screen 302D. Electronic system 300 further includes a docking station 304 with a connector 304A and a light or LED 304B.

Memory device 10 may be configured to engage docking station 304 by engaging connector 18 to connector 304A. LED 304B when activated, may illuminate all or part of memory device 10 on device 10 connecting to docking station 304. Docking station 304 may be connected to computer 302 by a data cable 302C. Data cable 302C may connect to computer connector 302A or to another communications port. Alternatively, memory device 10 may be connected to computer 302 at computer connector 302A.

Memory device 10 or docking station 304 may alternatively or additionally be configured to make a wireless connection 304C to computer 302 or other processor based device. Wireless protocols are common in the art and include an 802.x local are a network protocol and an infrared communication protocol. Memory device 10 may only perform authentication types of communication on the wireless connection such as supplying a password or identifying code. Alternatively or additionally, memory device 10 may transfer data files and commands over wireless connection 304C.

Data may be exchanged between memory device 10 and computer 302 when memory device 10 is connected to computer 302. Audio files, network addresses, identification codes, and/or picture files may be transferred between device 10 and computer 302.

Toy electronics system 300 may further include a memory medium 306. Memory medium 306 may be a compact disk and may be included in the purchase of memory device 10 and may include software applications and commands associated with memory device 10. Memory medium 306 may install applications and algorithms into computer memory 302C when memory medium 306 is accessed by computer 302.

Memory device 10 may accept an external memory card 308 at memory slot connector 32. External memory card 308 and slot connector 32 may be configured in any format such as compact flash or memory stick. Memory slot connector 32 may be compatible with more than one format of memory card.

Memory device software applications may also be displayed on computer 302 where device 10 is connected to computer 302 and computer 302 is not associated with any computer or network application software and without a connection to a network.

The one or more LEDs 36 and/or 304B may be configured to pulsate, such as with the beat of music being played by the removable memory device. Finally, the one or more LEDs may be positioned to function in conjunction with character shell 14 as an additional ornamental feature. For example, the one or more LEDs may be positioned behind the mouth, eyes, ears or other regions of a figure depicted on the ornamental cover so as to emit visible light through transparent or translucent regions of the ornamental cover.

Figure 7:
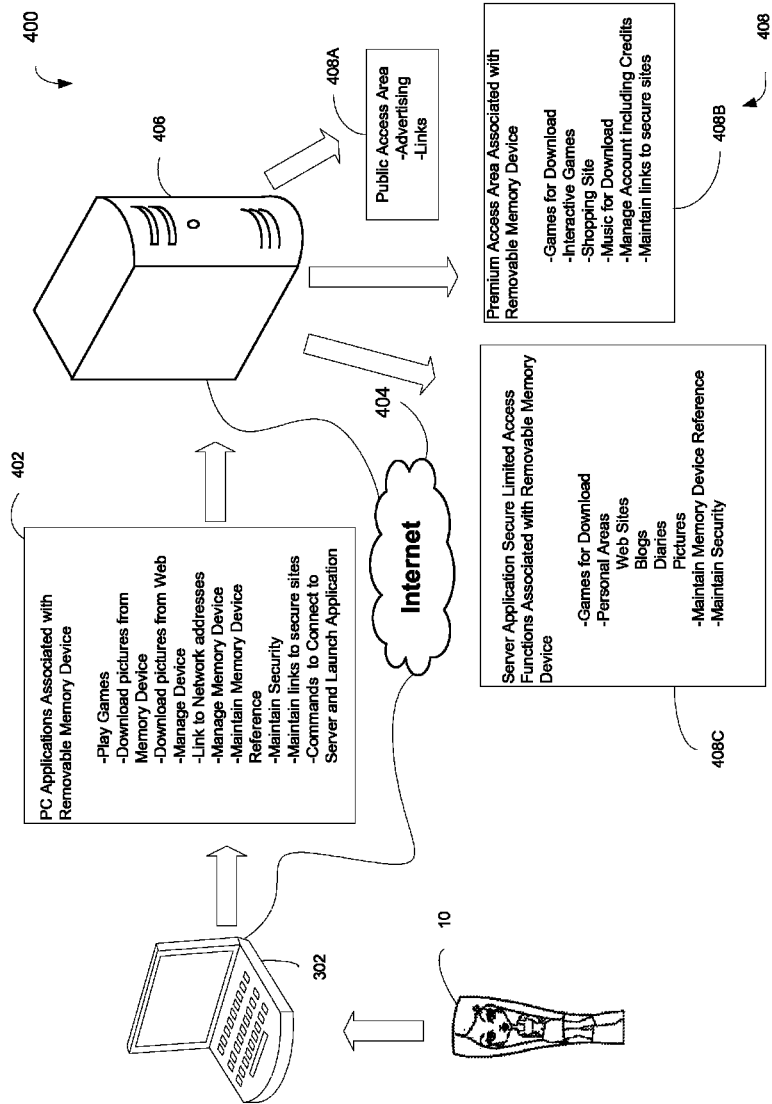
FIG. 7 is an exemplary electronic toy system including a removable memory device, a computer, a server and software applications.

FIG. 7 is a diagram of an exemplary electronic toy system 400 including memory device 10, computer 302, a computer software application 402, an Internet 404, a server 406 and a server software application 408. Connecting memory device 10 to computer 302 at docking station 304 or connector 302A may cause computer software application 402 to launch on computer 302. Application 402 may include network addresses and identification for associated users and content associated with the character depicted by portion 14 of memory device 10. Application 402 may include tools for configuring device 10, downloading picture files from device 10, installing game applications, and selecting and installing audio files on device 10. Application 402 may be implemented as part of an internet browser.

Application 402 and/or computer 302 may further connect over internet 404 to a server 406. Server 406 may store an application 408 associated with computer application 402 and memory device 10. Application 408 may include web pages and other tools. Application 408 may provide a library of pictures, games and audio files for download as well as personal web pages, virtual shopping and spaces for interactions with other users.

Application 408 may include a public access area or web page 408A, a premium access area or web page 408B and a private or limited access area or web page 408C that may be customized by the user. Each page may be linked to the other pages. Initial access to web page 408A to register or provide a password may be required in order to access the other pages. Access to web pages 408B and 408C may require purchase of a memory device 10.

Public access web page 408A may be accessed without purchasing memory device 10. Web page 408A may have advertising or limited access to games and audio files. Public access area 408A may also have a portal or provide access to a premium access area or web page 408B associated with memory device 10.

Premium access area or web page 408B may include access to premium services that are only available with purchase of memory device 10. Area or web page 408B may have audio files, games and pictures for download. Web page 408B may have tools for managing a user's account such as modifying passwords or setting preferences.

Limited access area or web page 408C may be a personal web page that can be customized by the user to reflect their preferences. A user may be able to set up a web page with content such as pictures and text. A user's web page 408C may include a blog, diaries, pictures and preferences. Web page 408C may have tools for maintaining security, maintaining a memory device reference and for registering other users as a "best friend" allowing additional access to the user's web page by the designated friend.

Figure 8:
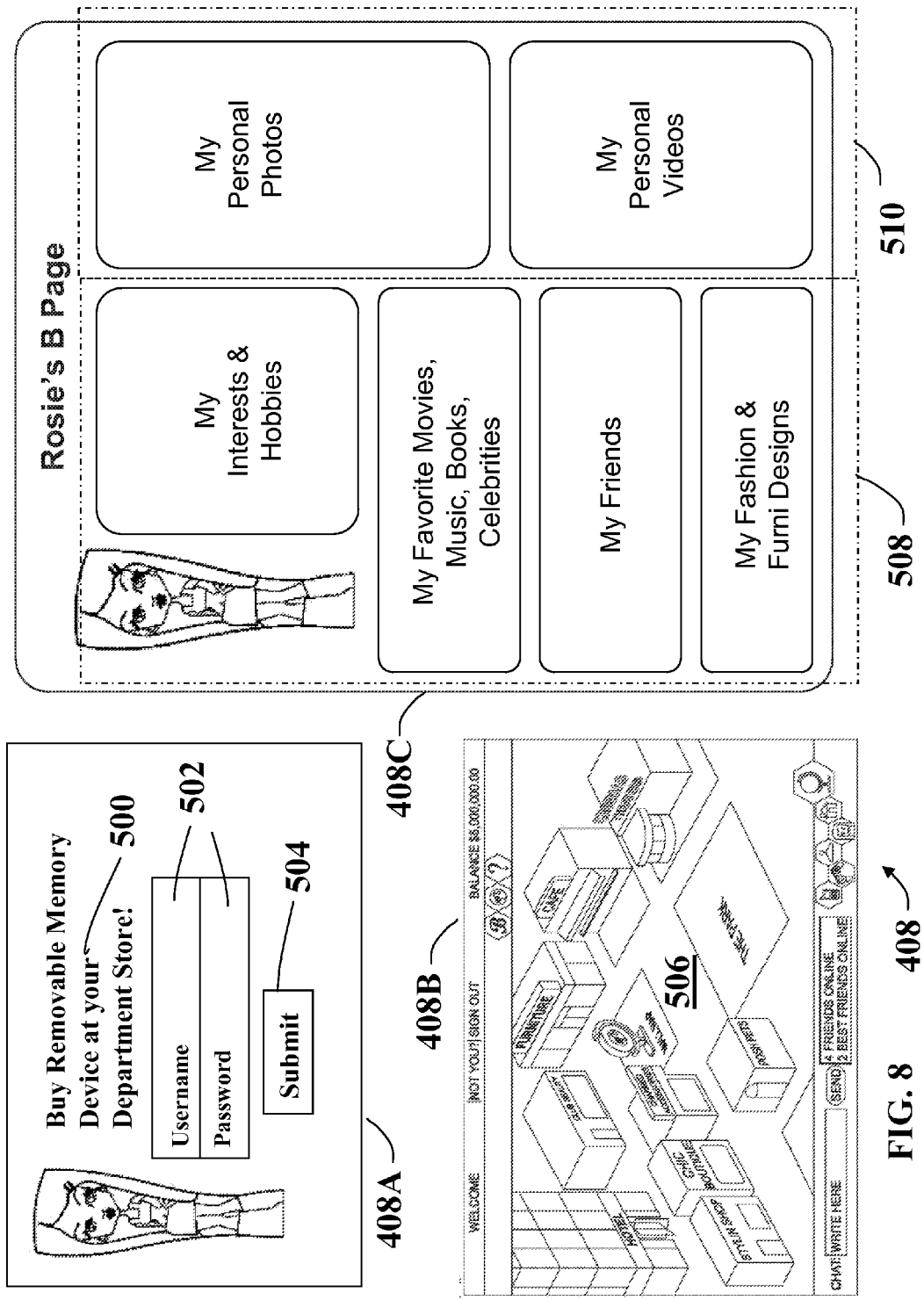
FIG. 8 shows example web pages that may be displayed when a server software application is accessed by a user.

FIG. 8 is a more detailed view of exemplary web pages that may be displayed by server application 408 on user access. Server application 408 in this example includes a public access web page 408A, premium web page 408B and a limited access personal web page 408C. Web page 408A includes an advertisement 500 for a memory device 10, fields 502 for entry of username and password and a submit button 504.

Example web page 408B shows a virtual shopping area with stores 506 that may be accessed by the user by clicking on them on computer 302. Web page 408C is an example personal web page. Web page 408C may include a limited access section 508 and private access section 510. Section 508 may include content and information that does not identify the user. Section 508 may display interests, preferences, hobbies, friends and favorite movies books and celebrities. Private section 510 may include photos and videos that are more personal and may identify the user more specifically. Section 510 may further include diary entries, blog entries and security and access data and tools.

A user may be provided credits that are only of value in the premium area 408B. Premium access area 408B may include a virtual shopping mall with stores 506 that include virtual merchandise. A user may access a specific store by clicking on a store 506 on web page 408B.

Figure 9:
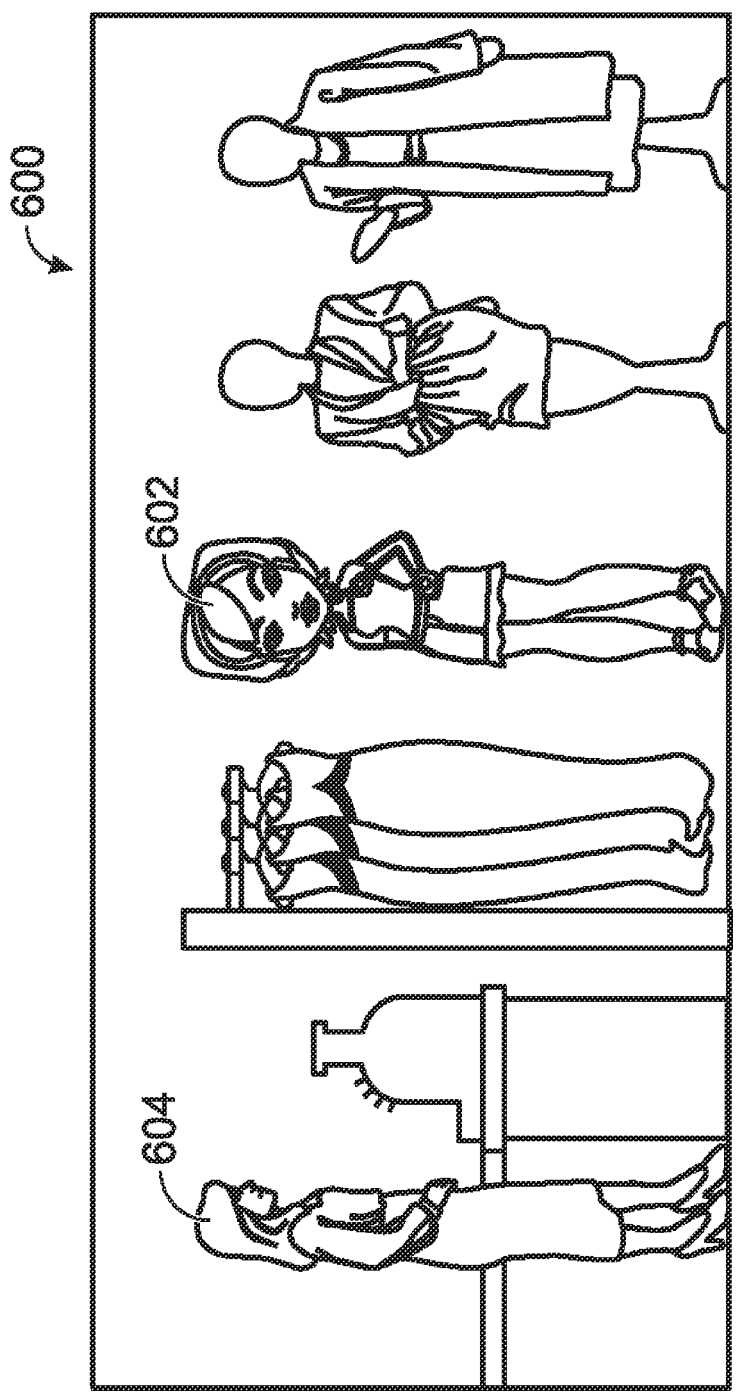
FIG. 9. is an example web page that may be displayed by a server software application showing a user character and an application character in a virtual dress shop.

FIG. 9 is a view of an exemplary web page 600 that may be accessed by clicking on a store 506. Store 506 may be any kind of store including a pet shop, a dress shop or a theater. Web page 600 displays an exemplary dress shop. A user avatar 602 may be displayed that resembles the character of character shell 14. The shop may include a shopkeeper avatar 604. Avatar 602 may be able to interact with avatar 604 to purchase merchandise. The user may be able to control movements and actions of avatar 602 at computer 302. A user may use accumulated credits to purchase virtual merchandise in store 506 and use the purchased merchandise.

For example, a user may access a poster store in the virtual mall of web page 408B and use credits to purchase a poster. The user may then display the purchased poster in their customized limited access area 408C.

A user may also be able to interact with other users represented by avatars. For example, the shopping mall may have several avatars shopping at once, each avatar representing a user logged on to the web page. Several avatars may play games together while accessing premium access area 408B. For example, several avatars may play a board game together by providing input at their computers 302. Users represented by avatars may play tennis together at a virtual tennis court and the users may be able to manipulate avatars holding virtual rackets to hit the ball.

Users may be able to create their own avatar 602. A user may be able to create an avatar using tools and applications in software applications 402 and/or 408. A user may be able to select different parts of an avatar such as eyes, hair, face, outfit and/or accessories from a menu of selections. Once parts are selected to create an avatar, the user may save the selections and the avatar created may appear on the premium pages 408B and private pages 408C when the user logs on.

On purchasing a removable memory device 10, a user may plug it into personal computer 302. This initial physical and operative association of the memory device to the computer may initialize computer application 402 and register the device by recording an identification code stored in memory 26 of device 10. The user may also define a username and password that is registered with computer application 402 and/or the server application 408. Once the user establishes an initial association to the user's memory device, the user may be able to access software applications 402 and 408 using only the username and password. The username and password may provide access to restricted content on server 406.

Purchase of removable memory device 10 may include an additional memory medium 306 such as a CD for installing software application 402 on computer 302. Alternatively, connecting computer 302 to a network location stored on or related to device 10 may provide for download of application software from the network location to computer 302. The network location for download may be server 406. Alternatively, software may be downloaded both from a portable memory medium 306 and from a server 406 to computer 302.

An initial registration procedure may require device 10 to be physically connected to computer 302. After the registration procedure computer application 402 may be accessed by the user with or without the physical association of memory device 10. The user may access application 402 to play games, download pictures from the Internet, connect to other network addresses or to launch server application 408 stored on server 406. Server software application 408 may also require physical association of memory device 10 to computer 302 to initially register the user and/or to provide a username and password for access to premium access areas and personal web pages.

The connection between removable memory device 10 and computer 302 or other electronic device may be made via a USB port or other type of electrical connection. After removable memory device 10 is communicably connected to computer 302 or other electronic device, user selectable options may be displayed on computer screen 302D. The options may include: playing stored games, or accessing linked web sites, and/or managing the configuration of the removable memory device 10. Following selection by a user, removable memory device 10 may be configured to connect to the desired option.

Figure 10:
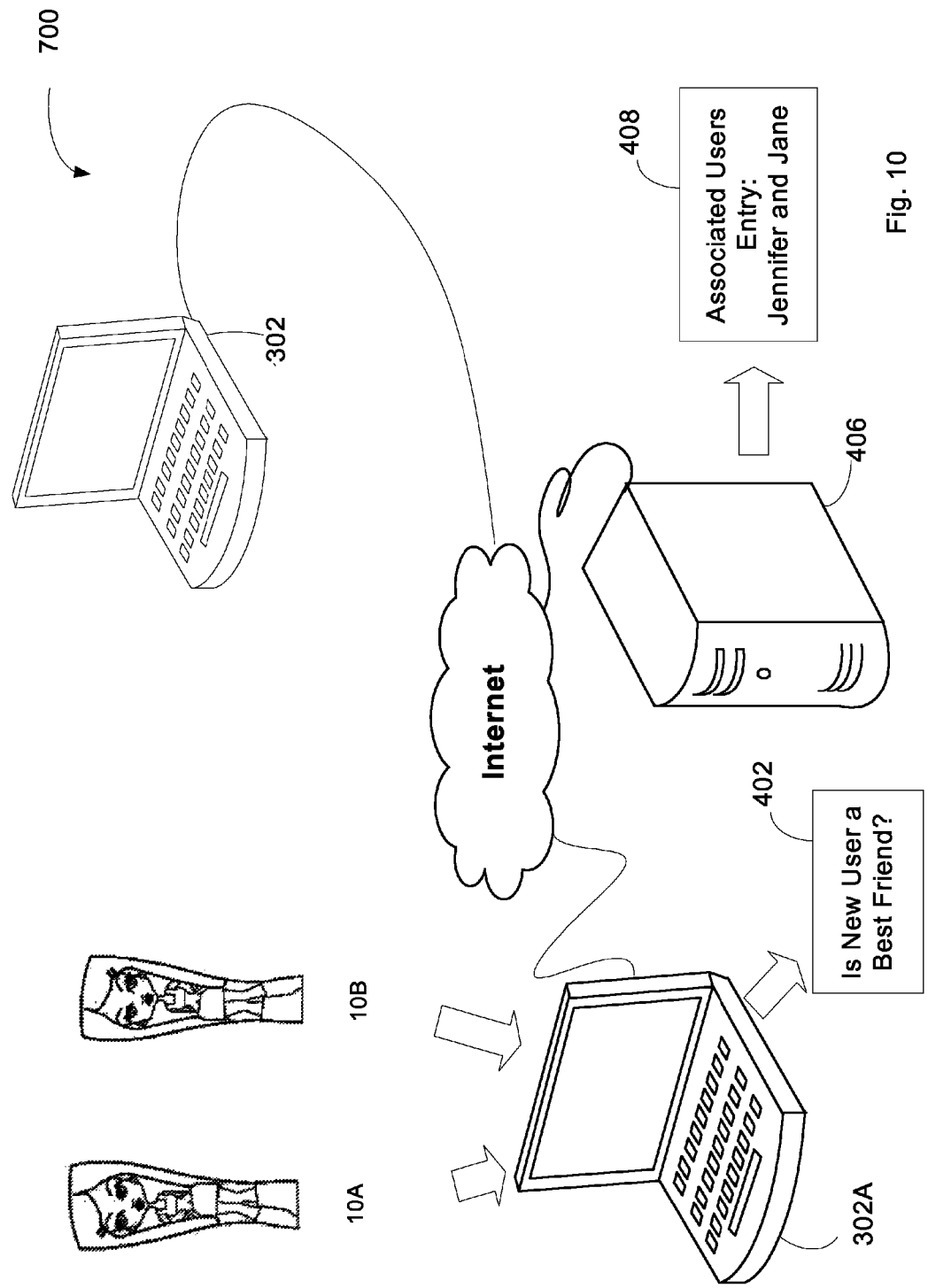
FIG. 10 is an example of associating two removable memory devices belonging to two different users as best friends to provide access to private web pages and additional functions.

Physically associating memory devices belonging to two users on one computer may allow the two users to share content in private areas 408C on the personal computers or the server. FIG. 10 is a diagram illustrating a process 700 for two users with memory devices 10A and 10B to associate their devices at the same computer 302A. Memory device 10A may have been previously associated with computer 302A and memory device 10B may have been previously associated with computer 302B at a location physically separate from computer 302A.

Computer application 402 may launch a new user interface on the second user plugging device 10B into computer 302A. The user interface may prompt the user whether the new device should be registered as an associated user. If the user with memory device 10A agrees, the user of device 10B may be defined as a "best friend" and both users may be able to access restricted information for the other user such as web sites, personal pictures, videos, diaries, chat rooms and/or instant messaging. The "best friend" associations may be stored on server 406 by application 408. Once registered, physical association of the memory devices to a computer may not be required for either user to access the restricted content of the other user.

On logging in from any computer, "best friends" users may have mutual access to each other's entries on personal pages such as diary entries and log entries. They may be able to share files such as music and pictures. Users that are not associated at server 406 as a "best friend" may not be able to access restricted content developed by other users.

On logging on to server application 408, a user may be able to determine if other associated users are logged on. A count of users and/or best friends logged in may be listed on the web pages. Users may be represented by avatars that appear on the screen on logging in. The avatars representing associated friends may have a similar appearance to the character depicted on shell 14 of memory device 10 belonging to that associated user.

The computer and/or server applications 402 and 408 may allow users to exchange text messages in a format that allows discussions to take place. An interactive screen may display text entries sent by multiple users logged on simultaneously. The interaction on screen may be similar to instant messaging.

In the event of misplacing a user's memory device or the inadvertent disclosure of a username and password to a third party, server application 408 may be configured to restrict access to content normally associated with the misplaced device or non secure username. This content with restricted access may include user web page 408C, user profile, and access to content of "best friends." A user may be able to change passwords or register a new memory device to remove the restrictions to the personal content.

Figure 11:
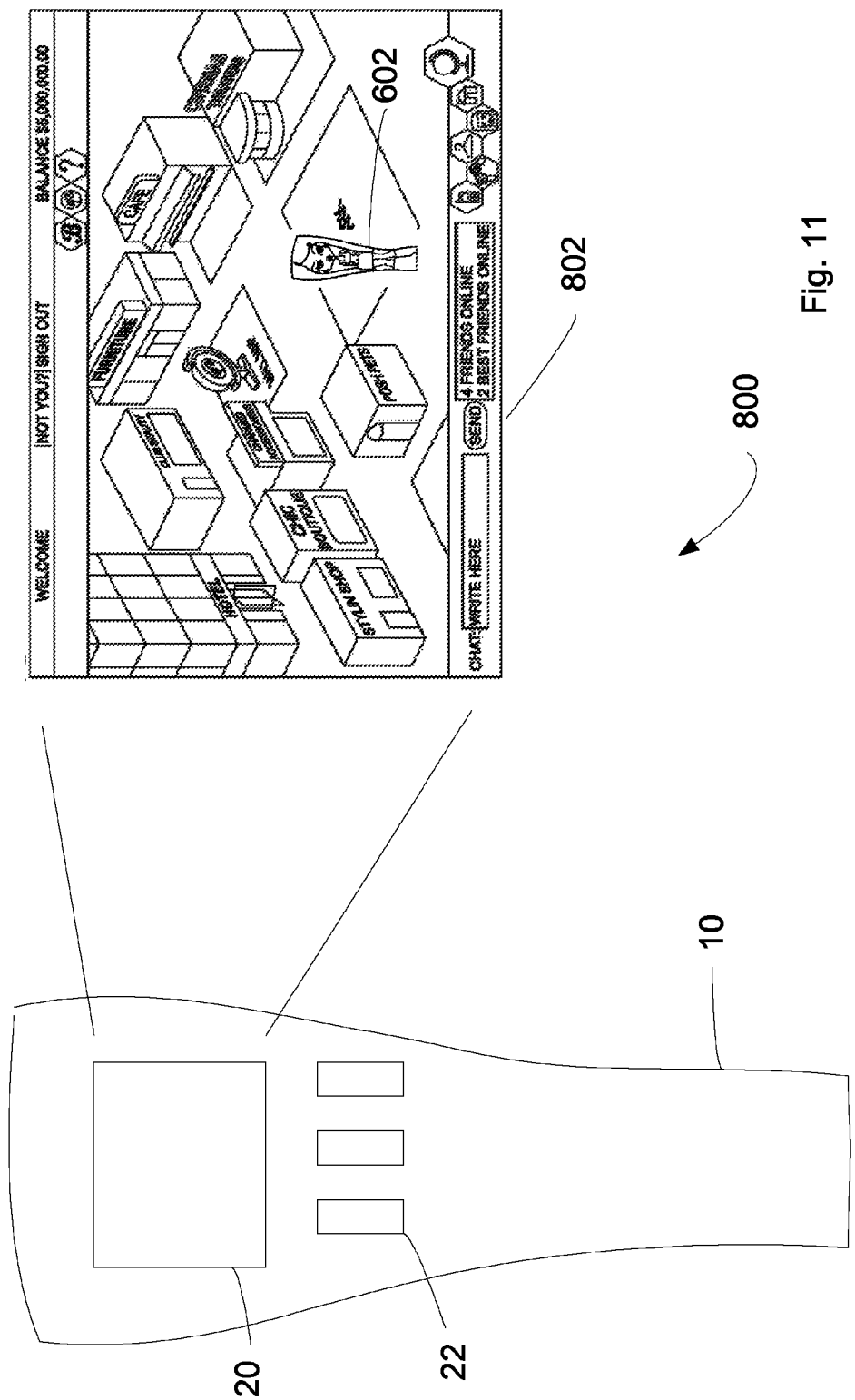
FIG. 11 is an example of a game that may be displayed by a removable memory device operating in a stand alone mode.

Removable memory device 10 may also be capable of storing and launching software applications in a stand alone operating mode separate from computer 302, computer software application 402 and server application 408. FIG. 11 is a representation of an application or game 802 displayed on memory device 10 operating in a stand alone mode. Game 802 may display user avatar 602. User avatar 602 may be directed by the user at computer 302 to pursue activities associated with the game following game rules.

While embodiments of a removable memory device and methods of use have been particularly shown and described, many variations may be made therein. This disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure. An appreciation of the availability or significance of claims not presently claimed may not be presently realized. Accordingly, the foregoing embodiments are illustrative, and no single feature or element, or combination thereof, is essential to all possible combinations that may be claimed in this or a later application. Each claim defines an invention disclosed in the foregoing disclosure, but any one claim does not necessarily encompass all features or combinations that may be claimed. Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

We claim:

1. A toy electronic device comprising:
a housing sized to fit in the hand and including a case defining an enclosure and at least one character shell configured to resemble a character and to be frictionally attached to the case;
memory mounted in the case and storing software commands, files and network addresses;
a first connector mounted in the case and configured to be connected to a computer;
a second connector mounted in the case and configured to be connected to an audio output device; and
a processor mounted in the case and operably connected to the memory and the first and second connectors for transferring data received on the first connector to the memory, and selectively operable for transferring data from the memory to the second connector.

2. The toy electronic device of claim 1 wherein the memory stores data associated with the character depicted by the shell portion.

3. The toy electronic device of claim 1 wherein the memory further stores audio files, and the device further includes a user input for manually selecting audio files stored in the memory and to play the selected files at the audio output device.

4. The toy electronic device of claim 3 wherein the audio files are MP3 formatted files.

5. The toy electronic device of claim 1 wherein the first connector is configured to be moved relative to the case between a first position with the connector disposed in the case, and a second position in which the connector extends beyond the case.

6. The toy electronic device of claim 1 wherein the character shell is further configured to resemble a character with a body and includes at least one accessory configured, at least in part, to resemble clothes, the at least one accessory being frictionally supported on the character shell.

7. The toy electronic device of claim 1 wherein the character shell is at least partially translucent and the case includes at least one light source configured to direct light through the character shell portion.

8. The toy electronic device of claim 1 further comprising a third connector mounted in the case, operably connected to the processor, and configured to frictionally receive a memory device.

9. The toy electronic device of claim 1 further comprising a docking station having a fourth connector configured to operatively connect to the first connector and a communication link configured to connect the fourth connector to a computer data port.

10. The toy electronic device of claim 9 wherein the docking station includes a light configured to illuminate the character shell when the fourth connector is connected to the first connector.

11. A doll system for launching a software application comprising:
a computer including:
a display,
first memory storing a first software application and software commands;
a first connector; and
a first processor operably connected to the first memory, the display and the first connector; and
a character memory device including:
an elongate housing with a character shell depicting in relief, at least in part, a character;
a second connector mounted in the housing and configured to be selectively and operably connected to the first connector;
a second processor mounted in the housing and connected to the second connector; and
a second memory mounted in the housing and operably connected to the
second processor for storing software commands and network addresses;
wherein the first computer processor is configured to launch the first software application in response to the second connector operably engaging the first connector.

12. The doll system of claim 11 wherein the housing includes a case defining an enclosure, and the character shell of the housing is frictionally attached to the case.

13. The doll system of claim 11 wherein the computer is further configured to connect to the internet and the computer further includes an internet browser, configured to access an internet location associated with an internet address, and accessing an internet address stored in the second memory launches a second software application stored at the internet address.

14. The doll system of claim 11 wherein the character shell of the housing includes an accessory associated with the depicted character, the accessory being adapted to be manually repeatedly attached to the character shell of the housing.

15. The doll system of claim 11 wherein the memory device further includes at least one sound generating device connected to the second processor, a user input connected to the second processor, and the second memory further stores audio files selectable at the user input, and the second processor is configured to play at the sound generating device an audio file selected with the user input.

16. The doll system of claim 11 wherein the second connector is configured to be moved between a first position extending from the housing and a second position disposed inside the housing.

17. A doll system for launching a software application comprising:
a character memory device including:
an elongate housing with a character shell depicting in relief a character;
a first connector configured to be moved between a first position with the first connector disposed in the housing, and a second position in which the first connector extends beyond the housing;
a processor mounted in the housing and connected to the first connector; and
device memory mounted in the housing and operably connected to the processor for storing software commands;
a memory medium readable by a processor and storing applications and software commands executable by the processor including:
a first software application with content related to the character depicted on the character shell of the character memory device;
a first set of one or more software commands which when executed launches the first software application on detecting the character memory device; and
a second set of one or more software commands which when executed launches a second software application stored at a network address where content of the second software application is related to the character depicted on the character shell of the memory device.

18. The doll system of claim 17 wherein the elongate housing includes a case defining an enclosure, and the character shell of the housing is frictionally attached to the case.

19. The doll system of claim 18 wherein the character shell is at least partially a light guide, such that light introduced into the guide illuminates all or part of the at least one character shell of the housing, and the case includes a light source configured to direct light into the guide.

20. The doll system of claim 17 wherein the device memory further stores audio files, and the device further includes a second connector configured to connect to an audio output device and a user input for selecting audio files in memory and to play the selected files at the audio output device.

* * * * *